(12) United States Patent
Ikarashi

(10) Patent No.: US 10,496,328 B2
(45) Date of Patent: Dec. 3, 2019

(54) MEMORY CONTROL CIRCUIT AND MEMORY CONTROLLING METHOD

(71) Applicant: Sony Corporation, Tokyo (JP)

(72) Inventor: Takahiro Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/565,522

(22) PCT Filed: Apr. 26, 2016

(86) PCT No.: PCT/JP2016/062996
§ 371 (c)(1),
(2) Date: Oct. 10, 2017

(87) PCT Pub. No.: WO2016/185878
PCT Pub. Date: Nov. 24, 2016

(65) Prior Publication Data
US 2018/0088864 A1 Mar. 29, 2018

(30) Foreign Application Priority Data

May 20, 2015 (JP) .................................. 2015-102624

(51) Int. Cl.
*G06F 3/06* (2006.01)
*G06F 12/02* (2006.01)
(Continued)

(52) U.S. Cl.
CPC ............ *G06F 3/0659* (2013.01); *G06F 12/02* (2013.01); *G06F 13/16* (2013.01);
(Continued)

(58) Field of Classification Search
CPC ........ G06F 3/0659; G06F 12/02; G06F 13/16; G06F 13/4232; G11C 7/22; G11C 8/12;
(Continued)

(56) References Cited

U.S. PATENT DOCUMENTS 6,108,252 A * 8/2000 Park .................. G11C 29/50012
365/189.07
6,342,895 B1 * 1/2002 Kim ........................ H04N 19/61
345/531

(Continued)

FOREIGN PATENT DOCUMENTS

| JP | 63-120348 A | 5/1988 |
| JP | 2008-041142 A | 2/2008 |
| JP | 2011-28790 A | 2/2011 |

*Primary Examiner* — Larry T Mackall
(74) *Attorney, Agent, or Firm* — Michael Best & Friedrich LLP

(57) ABSTRACT

A memory control circuit of the disclosure includes a memory control unit that controls a timing of command issuance to cause (tATP+tPTA) to be constant, where, in a memory having a plurality of banks, tATP is a period from issuance of a first ACT command to issuance of a PRE command that is directed a bank same as or different from a bank to which the first ACT command is issued, and tPTA is a period from the issuance of the PRE command to issuance of a second ACT command that is directed to a bank same as or different from the bank to which the PRE command is issued.

10 Claims, 4 Drawing Sheets

(51) Int. Cl.
*G11C 7/22* (2006.01)
*G06F 13/16* (2006.01)
*G06F 13/42* (2006.01)
*G11C 11/406* (2006.01)
*G11C 8/12* (2006.01)
*G11C 11/4076* (2006.01)

(52) U.S. Cl.
CPC ............ *G06F 13/4234* (2013.01); *G11C 7/22* (2013.01); *G11C 8/12* (2013.01); *G11C 11/4076* (2013.01); *G11C 11/40603* (2013.01); *G11C 11/40615* (2013.01); *G11C 11/40618* (2013.01)

(58) Field of Classification Search
CPC ........ G11C 11/40603; G11C 11/40615; G11C 11/40618; G11C 11/4076
See application file for complete search history.

(56) References Cited

U.S. PATENT DOCUMENTS

| | | | |
|---|---|---|---|
| 2003/0112677 A1* | 6/2003 | Lehmann | G11C 7/12 365/203 |
| 2008/0175081 A1* | 7/2008 | Kim | G11C 7/1042 365/203 |

* cited by examiner

[ FIG. 1 ]
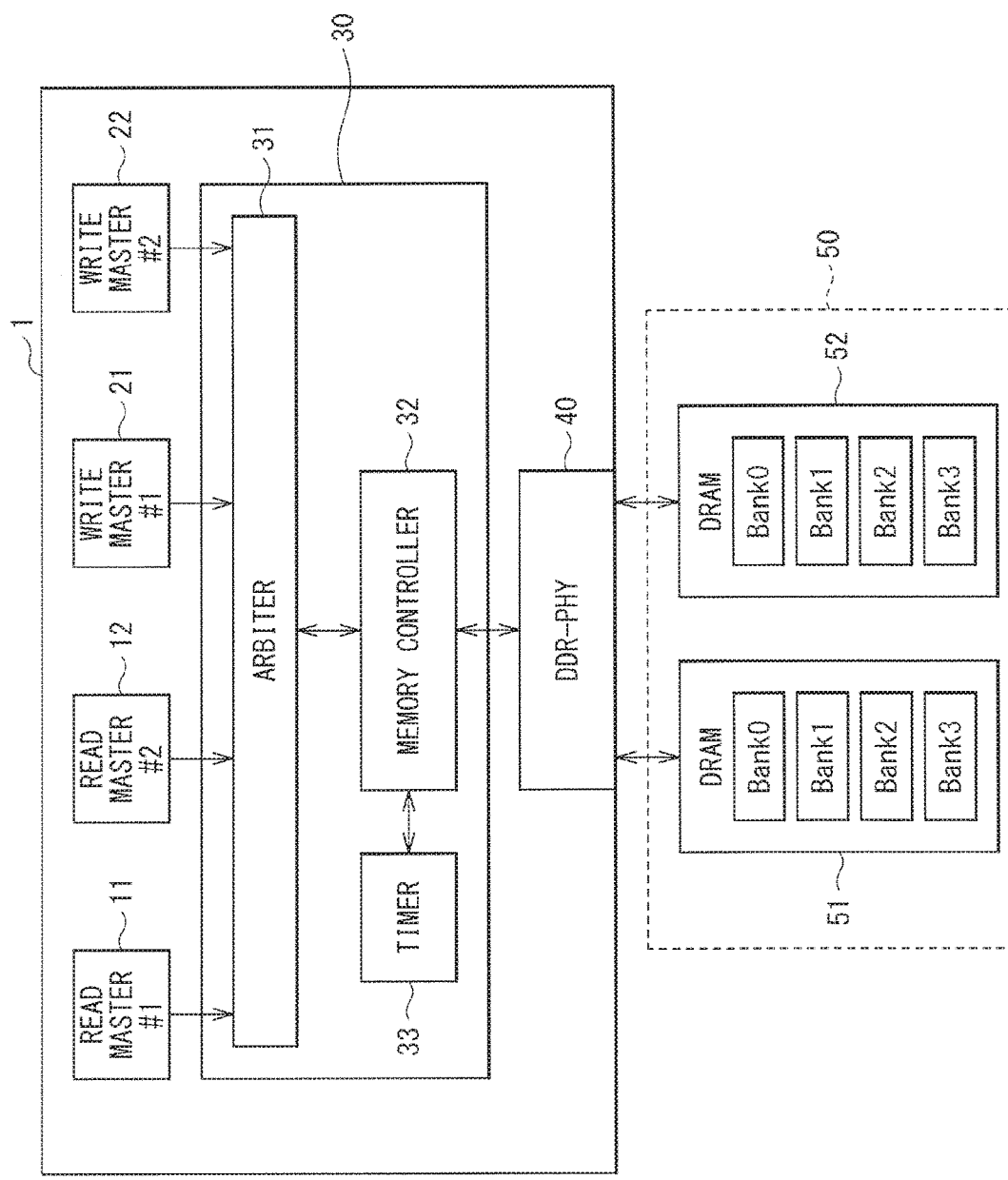

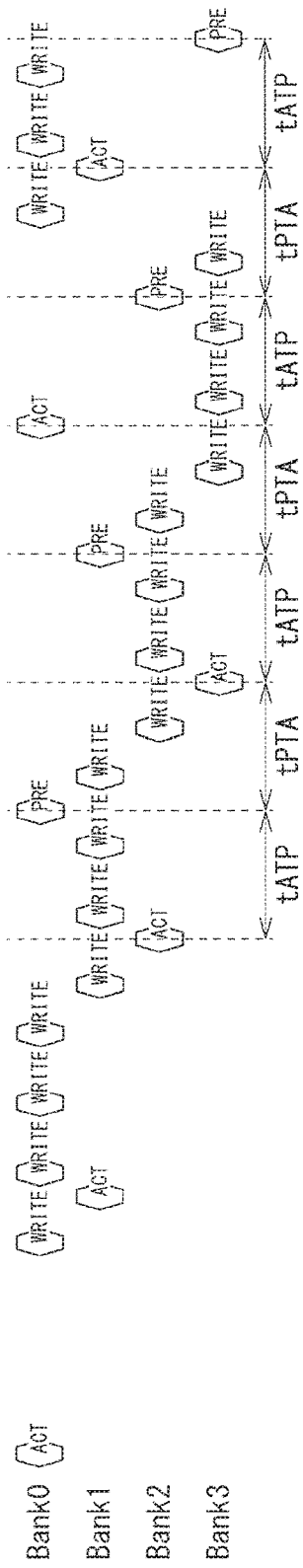
[FIG. 2]

[FIG. 3]
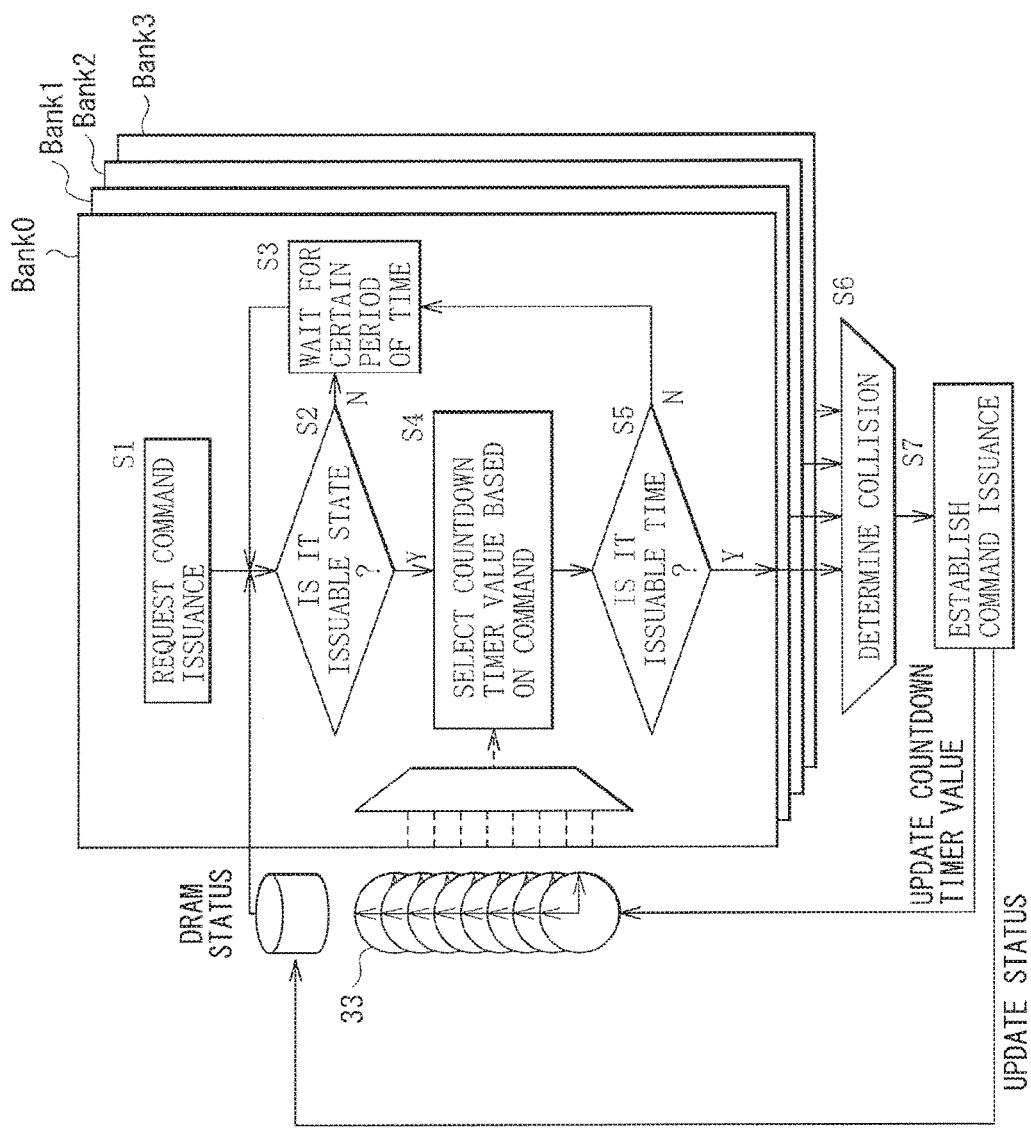

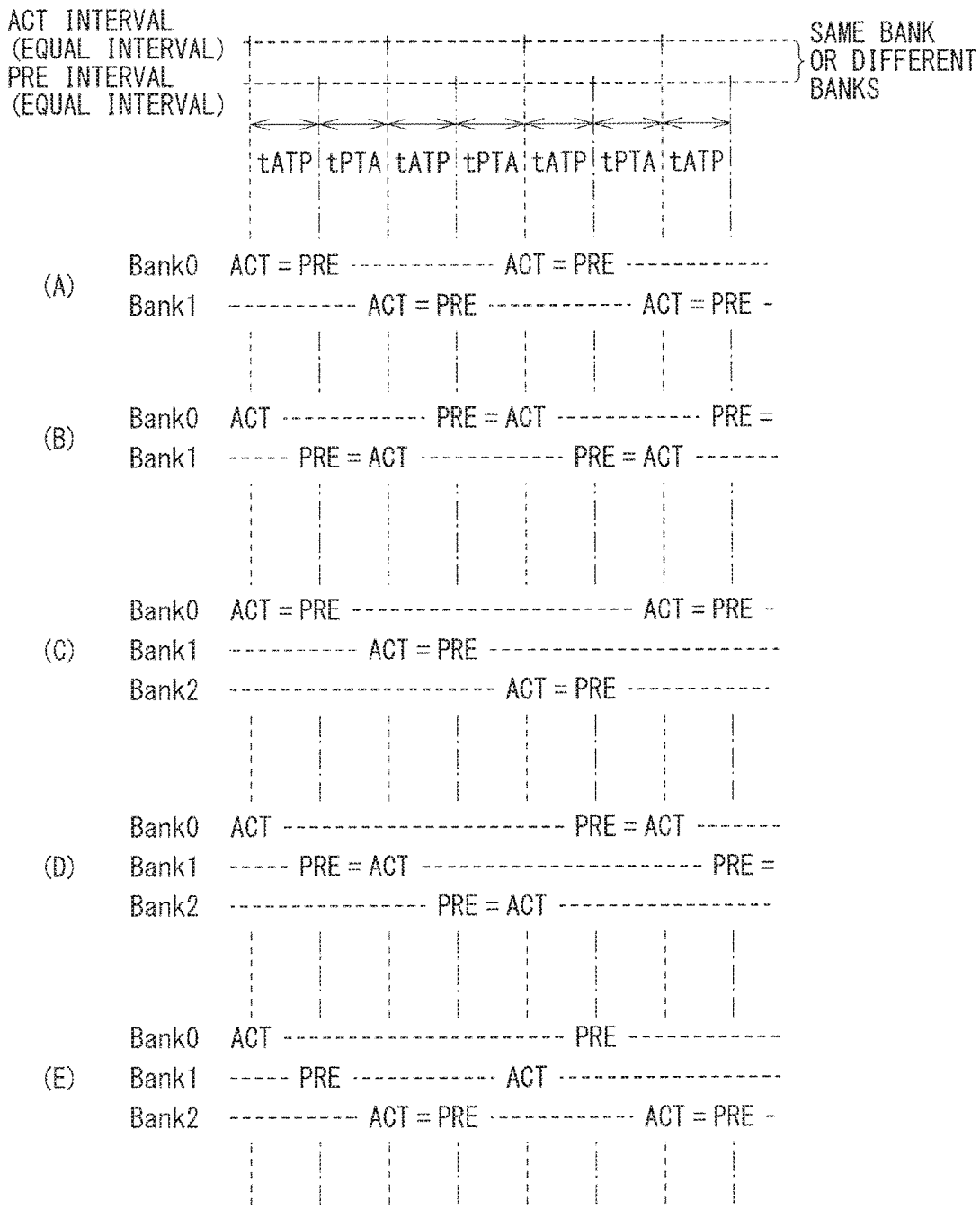

MEMORY CONTROL CIRCUIT AND MEMORY CONTROLLING METHOD

TECHNICAL FIELD

The disclosure relates to a memory control circuit and a memory controlling method that are suitable for a DRAM (Dynamic Random Access Memory).

BACKGROUND ART

In an electronic apparatus mounted with a DRAM, there are cases where noise generated by the DRAM exerts an influence on the performance of the electronic apparatus. Various techniques are disclosed that are directed to a reduction of the influence of such noise. For example, Patent Literature 1 discloses a semiconductor storage device that has a plurality of DRAM memory sections and in which timings of refreshing operations are shifted from one another in the respective DRAM memory sections. In the semiconductor storage device, suppression is achieved of power supply noise caused by the refreshing operation, by shifting the timings of the refreshing operations from one another.

CITATION LIST

Patent Literature

Patent Literature 1: Japanese Unexamined Patent Application Publication No. 2011-28790

SUMMARY OF THE INVENTION

There are cases where a DRAM becomes a noise source, and an influence of electromagnetic noise that an electric circuit close thereto receives becomes an issue as described above. One example is a sensor module. A sensor is demanded to be high in detection accuracy. It is expected that the use in which the sensor is close to the DRAM will be increased in future due to an increase in volume of data that the sensor outputs. As a method of reducing the noise of the DRAM, there is, for example, a method of shifting timings of refreshing operations from one another as described in Patent Literature 1, besides a classic measure such as insertion of a shield insertion. Further, there may be a necessity of performing such a control of command issuance by which the DRAM is prevented from becoming the noise source and a bandwidth of data transfer, which is a purpose of using the DRAM, is not impaired.

It is desirable to provide a memory control circuit and a memory controlling method that are able to reduce a noise generated when accessing to a memory.

A memory control circuit according to one embodiment of the disclosure includes a memory control unit that controls a timing of command issuance to cause (tATP+tPTA) to be constant, where, in a memory having a plurality of banks, tATP is a period from issuance of a first ACT command to issuance of a PRE command that is directed a bank same as or different from a bank to which the first ACT command is issued, and tPTA is a period from the issuance of the PRE command to issuance of a second ACT command that is directed to a bank same as or different from the bank to which the PRE command is issued.

A memory controlling method according to one embodiment of the disclosure includes controlling a timing of command issuance to cause (tATP+tPTA) to be constant, where, in a memory having a plurality of banks, tATP is a period from issuance of a first ACT command to issuance of a PRE command that is directed a bank same as or different from a bank to which the first ACT command is issued, and tPTA is a period from the issuance of the PRE command to issuance of a second ACT command that is directed to a bank same as or different from the bank to which the PRE command is issued.

In the memory control circuit or the memory controlling method according to one embodiment of the disclosure, timings of the issuance of the ACT command and the PRE command are appropriately controlled.

According to the memory control circuit or the memory controlling method in one embodiment of the disclosure, the timings of issuance of the ACT command and the PRE command are appropriately controlled. Thus, it is possible to suppress a fluctuation in issuance cycle of the ACT command and the PRE command. Hence, it is possible to reduce a noise generated when accessing to a memory.

Incidentally, effects that are described here are not necessarily limitive and may be any of effects described in the disclosure.

BRIEF DESCRIPTION OF THE DRAWINGS

FIG. 1 is a block diagram illustrating one configuration example of a memory bus system including a memory control circuit according to one embodiment of the disclosure.

FIG. 2 is a timing chart illustrating one example of timings of issuing control commands.

FIG. 3 is a flowchart illustrating one example of an operation of controlling command issuance.

FIG. 4 is a timing chart illustrating a modification of the timings of issuing the control commands.

MODES FOR CARRYING-OUT THE INVENTION

In the following, embodiments of the disclosure will be described in detail with reference to the drawings. Incidentally, description will be made in the following order.

1. Memory Bus System including Memory Control Circuit
  1.1 Configuration (FIG. 1)
  1.2 Operation (FIG. 2 and FIG. 3)
  1.3 Modification (FIG. 4)
  1.4 Effects
2. Other Embodiments

1. Memory Bus System Including Memory Control Circuit

[1.1 Configuration]

FIG. 1 illustrates one configuration example of a memory bus system including a memory control circuit according to one embodiment of the disclosure.

A memory bus system 1 is provided with one or more bus masters, a memory control unit 30, and a DDR-PHY (physical interface) 40. The bus masters are configured by, for example, a plurality of READ masters 11 and 12, and a plurality of WRITE masters 21 and 22. The memory control unit 30 has an arbiter 31, a memory controller 32, and a timer 33.

Although FIG. 1 illustrates an example in which a memory 50 is configured by two DRAMs 51 and 52, the number of DRAMs is not limited to the number in the example. The DRAMs 51 and 52 each have a plurality of banks Bank0, Bank1, Bank2, and Bank3.

In addition, the memory 50 may be a memory having a bank grouping function, for example, a memory based on the DDR (Double Data Rate) 4 or LPDDR4 (Lower Power DDR4) standard. In this case, for example, the banks Bank0, Bank1, Bank2, and Bank3 of the DRAM 51 may be grouped as a first bank group BG0, and the banks Bank0, Bank1, Bank2, and Bank3 of the DRAM 52 may be grouped as a second bank group BG1.

The READ masters 11 and 12 each make a READ (reading) request to the memory 50. The READ masters 11 and 12 each supply a read address to the memory 50 via the memory control unit 30 and the DDR-PHY 40. In addition, the READ masters 11 and 12 each receive read data that is read out of the memory 50 via the DDR-PHY 40 and the memory control unit 30. Incidentally, although FIG. 1 illustrates an example in which the READ master is configured by two masters, the number of READ masters is not limited to the number in this example.

The WRITE masters 21 and 22 each make a WRITE (writing) request to the memory 50. The WRITE masters 21 and 22 each supply a write (WRITE) address to the memory 50 via the memory control unit 30 and the DDR-PHY 40. In addition, the WRITE masters 21 and 22 each supply write data to be written into the memory 50 to the memory control unit 30, via the memory control unit 30 and the DDR-PHY 40. Incidentally, although FIG. 1 illustrates an example in which the WRITE master is configured by two masters, the number of WRITE masters is not limited to the number in this example.

The memory control unit 30 generates control commands in accordance with the requests made from the READ masters 11 and 12 and from the WRITE masters 21 and 22, and supplies the control commands to the memory 50 via the DDR-PHY 40. Incidentally, the control commands include a READ command, a WRITE command, an ACT command, a PRE command, and so forth.

The arbiter 31 performs arbitration of the requests made from the READ masters 11 and 12 and from the WRITE masters 21 and 22, and determines the order of the requests. Input and output of the requests relative to the arbiter 31 is specified on the basis of a protocol in general that performs an access to the memory 50, such as AHB (Advanced High-performance Bus), AXI (Advanced eXtensible Interface), and OCP (Open Core Protocol).

The memory controller 32 controls the operation of the memory 50 on the basis of instructions given from the arbiter 31. The memory controller 32 converts an output from the arbiter 31 into a DRAM access protocol, and thereby generates the control command.

The DDR-PHY 40 is a physical layer interface that couples between the memory controller 32 and each of the DRAMs 51 and 52 of the memory 50. The DDR-PHY 40 may be coupled to each of the DRAMs 51 and 52 via an unillustrated I/O terminal.

[1.2 Operation]

In the following, a specific example of a controlling operation performed on the memory 50 by the memory bus system 1 according to the present embodiment will be described with reference to FIG. 2 and FIG. 3. FIG. 2 illustrates one example of timings of issuing the control commands. FIG. 3 illustrates one example of the operation of controlling command issuance.

When the memory controller 32 makes a WRITE or READ access to the DRAMs 51 and 52, it is necessary to issue the ACT command and the PRE command inevitably. There is a possibility that, when issuing the ACT command and the PRE command, an electric current that flows inside the DRAMs 51 and 52 serves as electromotive force and thus-generated electromagnetic noise becomes a noise source, which may possibly exert an influence on an electric circuit that is close to the DRAMs 51 and 52.

Here, in the DRAMs 51 and 52, a period from issuance of the ACT command directed to a certain bank to shortest issuance of a PRE command directed to a bank that is the same as or different from the bank to which the ACT command is issued is referred to as tATP. In addition, a period from issuance of the PRE command directed to a certain bank to shortest issuance of an ACT command directed to a bank that is the same or different from the bank to which the PRE command is issued is referred to as tPTA. Incidentally, FIG. 2 illustrates an example in which tATP and tPTA are specified in accordance with the ACT command and the PRE command between the different banks.

In the present embodiment, the memory controller 32 controls timings of issuing the commands such that (tATP+tPTA) becomes constant. Although there is no restriction specified in the DRAM standard on tATP and tPTA, in the present embodiment, an issuance cycle of the ACT command and an issuance cycle of the PRE command are controlled so as not to cause fluctuation in the issuance cycle to the greatest possible extent, by issuing the ACT command or the PRE command such that tATP and tPTA have certain values that are 1 or greater, thereby reducing an amount of noise. As can be readily appreciated, an ACT-ACT shortest interval between the different banks and a PRE-PRE shortest interval between the different banks become (tATP+tPTA) after this new restriction is introduced. However, it is not necessary that tATP=tPTA be satisfied.

It is known that a period from one ACT command to another ACT command is, in general, specified as tRC between the same banks and as tRRD between the different banks, and the term is specified as tRRDL, tRRDS, and so forth in case where there are two or more bank groups. Although, in general, the period from one PRE command to another PRE command is not particularly specified, tPPd is defined in a case of the LPDDR4. If the timing of command issuance is controlled in the period from one ACT command to another ACT command and in the period from one PRE command to another PRE command, it is not possible to take a flexible measure upon collision of the commands that will be described in the following.

In general, after a time of issuance of a certain command is established, the memory controller 32 counts a time taken until the next command, which is necessary to satisfy the restriction on the command interval, becomes issuable from the time of issuance of the certain command as the starting point. Although it is necessary to issue the commands at the shortest intervals specified in the DRAM specification in order to acquire a wide data transfer bandwidth that is a purpose of using the DRAMs 51 and 52, it is anticipated that the command issuance requests collide with each other between the different banks depending on a specification of the command interval of the DRAMs 51 and 52 or depending on the issuance time of a command that has been issued in the past.

Since the number of ACT commands, the WRITE commands, or the READ commands acceptable in one clock is up to 1 in the DRAM standard, an algorithm is necessary that selects and determines a command to which priority is to be given between the different banks. In general, the WRITE commands and the READ commands are arrayed in advance in the same order as the data array, by means of a method such as the FIFO (First In, First Out) method. The commands to be prioritized in order to avoid the collision are the ACT command and the WRITE command, the ACT command and the READ command, the PRE command and the WRITE command, and the PRE command and the READ command. The simplest algorithm is a method that inevitably gives priority to the WRITE command or the READ command. In this case, the collided ACT command or the collided PRE command is issued with a delay of one clock. In a case of the same bank, a period from the ACT command to the PRE command is defined as tRAS, and a period from the PRE command to the ACT command is defined as tRP. There are cases where the command that is issued with a delay due to the collision causes the next command to be delayed as well due to restriction that is present until the next command is issued.

Next, an operation of controlling the command issuance by the memory controller 32 will be described with reference to FIG. 3. Incidentally, FIG. 3 illustrates together the operations of controlling the command issuance to be performed on the plurality of banks Bank0, Bank1, Bank2, and Bank3.

When the memory controller 32 receives one or more command issuance requests (step S1), the memory controller 32 determines whether the requested command is in an issuable state (state) in accordance with a DRAM status that is decided in accordance with the command issuance that has been established in the past (step S2). In a case where the requested command is in a non-issuable state (step S2: N), the memory controller 32 waits for a certain period of time until the requested command becomes issuable (step S3). In the DRAM state where the requested command is issuable (step S2: Y), the memory controller 32 selects, from the timer 33, a countdown timer value that is based on the bank and on the kind of the command that is scheduled to be issued (step S4). Thereby, the memory controller 32 determines whether it is the time at which the requested command is issuable (step S5). For example, the memory controller 32 determines that it is the command issuable time in a case where the countdown timer value is smaller than a certain fixed value. In a case where it is not the issuable time (step S5: N), the memory controller 32 waits for a fixed time until the issuable time comes (step S3). In a case where the issuable time comes (step S5: Y), the memory controller 32 makes a determination on the collision of the commands (step S6).

In a case where the plurality of command issuance requests are receivable, the memory controller 32 makes the determination on the collision of the commands. As a result of the determination, the memory controller 32 updates the DRAM status and the countdown timer value in accordance with the command issuance that has been established (step S7).

In the present embodiment, the memory controller 32 performs the control of the timing of the command issuance such that (tATP+tPTA) becomes constant as described above. In this case, when issuing the ACT command, the memory controller 32 decides the PRE command issuable time of any other bank on the basis of a predetermined initial value of tATP. In addition, when issuing the PRE command, the memory controller 32 decides the ACT command issuable time of any other bank on the basis of a predetermined initial value of tPTA.

Here, a case is supposed where a linear address is allocated to a DRAM memory map to perform a bank interleaving access. When a data transfer amount per bank corresponds to N-number of DRAM commands, a time necessary for the issuance of the WRITE command or the READ command per bank is tCCD*N. It is necessary to issue the ACT command and the PRE command both once per bank due to the transition of the banks involved. Accordingly, it is possible to perform the issuance of the ACT commands and the issuance of the PRE commands at equal intervals for all of the banks by taking tATP and tPTA such that tCCD*N=tAFP+tPTA is satisfied.

[1.3 Modification]

Incidentally, although in the above description, a case is exemplified where tATP and tPTA are specified by the ACT command and the PRE command between the different banks as illustrated in FIG. 2, there may be also cases where tATP and tPTA are specified by the ACT command and the PRE command that are directed to the same bank. In other words, there may be cases where tATP is specified by a period from the issuance of the ACT command to the issuance of the PRE command directed to a bank that is the same as the bank to which the ACT command is issued. In addition, there may be cases where tPTA is specified by a period from the issuance of the PRE command to the issuance of the ACT command directed to a bank that is the same as the bank to which the PRE command is issued.

(A) to (E) of FIG. 4 illustrate, in a simplified fashion, an example of the command issuance, including a case where tATP and tPTA are specified by the ACT command and the PRE command that are directed to the same bank. FIG. 4 illustrates a case where the ACT commands and the PRE commands are issued at equal intervals for the same bank or between the different banks as illustrated at an uppermost part. In (A) to (E) of FIG. 4, a period in which tATP or tPTA is specified by the same bank is denoted as "=". For example, in the example of (A) in FIG. 4, tATP is specified by the ACT command and the PRE command that are directed to the same bank, and tPTA is specified by the PRE command and the ACT command that are between the different banks. In addition, for example, in the example of (E) in FIG. 4, a case where tATP is specified by the ACT command and the PRE command that are directed to the same bank and a case where tATP is specified by the ACT command and the PRE command that are between the different banks are present in a mixed fashion.

Incidentally, as a matter of course, it is necessary for tATP to take a value that is at least tRAS and for tPTA to take a value that is at least tRP in case of the same bank.

[1.4 Effects]

As described above, according to the present embodiment, the timings of issuing the ACT command and the PRE command are appropriately controlled. Thus, it is possible to suppress the fluctuation in the issuance cycles of the ACT command and the PRE command. Hence, it is possible to reduce the noise generated when accessing to the memory 50.

Note that the effects described herein are merely illustrative and are not limitative, and that there may be other effects as well.

2. Other Embodiments

It is possible to modify a technique of the disclosure, without being limited to the description of the foregoing embodiment.

For example, the technology may also have the following configurations.

(1)

A memory control circuit including a memory control unit that controls a timing of command issuance to cause (tATP+tPTA) to be constant, where, in a memory having a plurality of banks, tATP is a period from issuance of a first ACT command to issuance of a PRE command that is directed a bank same as or different from a bank to which the first ACT command is issued, and tPTA is a period from the issuance of the PRE command to issuance of a second ACT command that is directed to a bank same as or different from the bank to which the PRE command is issued.

(2)

The memory control circuit according to (1), in which the memory control unit:

decides, when issuing the first ACT command, a time at which the PRE command is issuable on the basis of a predetermined value of the tATP; and decides, when issuing the PRE command, a time at which the second ACT command is issuable on the basis of a predetermined value of the tPTA.

(3)

A memory controlling method including controlling a timing of command issuance to cause (tATP+tPTA) to be constant, where, in a memory having a plurality of banks, tATP is a period from issuance of a first ACT command to issuance of a PRE command that is directed a bank same as or different from a bank to which the first ACT command is issued, and tPTA is a period from the issuance of the PRE command to issuance of a second ACT command that is directed to a bank same as or different from the bank to which the PRE command is issued.

(4)

The memory controlling method according to (3).

The present application is based on and claims priority from Japanese Patent Application No. 2015-102624 filed with the Japan Patent Office on May 20, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A memory control circuit comprising:
a memory control unit configured to perform:
after the memory control unit performs an issuance of a first ACT command, an issuance of a first PRE command to a first bank of memory or a second bank of the memory,
after the memory control unit performs the issuance the first PRE command, an issuance of a second ACT command to the first bank or the second bank, and
after the memory control unit performs the issuance of the second ACT command, an issuance of a second PRE command to the first bank or the second bank,
wherein a time interval from the issuance of the first ACT command to the issuance of the second ACT command is equal to a time interval from the issuance of the first PRE command to the issuance of the second PRE command.

2. The memory control circuit according to claim 1, wherein the memory control unit is configured to perform the issuance of the first ACT command to the first bank.

3. The memory control circuit according to claim 1, wherein a time interval from the issuance of the first ACT command to the issuance of the first PRE command is equal to a time interval from the issuance of the second ACT command to the issuance of the second PRE command.

4. The memory control circuit according to claim 3, wherein the memory control unit configured to wait for duration of the time interval from the issuance of the first ACT command to the issuance of the first PRE command before performing the issuance of the first PRE command.

5. The memory control circuit according to claim 3, wherein the memory control unit configured to wait for duration of the time interval from the issuance of the first PRE command to the issuance of the second ACT command before performing the issuance of the second ACT command.

6. A memory controlling method comprising:
issuing, by a memory control circuit, a first PRE command to a first bank of memory or a second bank of the memory, wherein the memory control circuit issues the first PRE command after the memory control circuit issues a first ACT command;
issuing, by the memory control circuit, a second ACT command to the first bank or the second bank, wherein the memory control circuit issues the second ACT command after the memory control circuit issues the first PRE command; and
issuing, by the memory control circuit, a second PRE command to the first bank or the second bank, wherein the memory control circuit issues the second PRE command after the memory control circuit issues the second ACT command,
wherein a time interval from issuing the first ACT command to issuing the second ACT command is equal to a time interval from issuing the first PRE command to issuing the second PRE command.

7. The memory controlling method according to claim 6, further comprising:
issuing, by the memory control circuit, the first ACT command to the first bank, wherein the memory control circuit issues the first ACT command before the memory control circuit issues the first PRE command.

8. The memory controlling method according to claim 6, wherein a time interval from issuing the first ACT command to issuing the first PRE command is equal to a time interval from issuing the second ACT command to issuing the second PRE command.

9. The memory controlling method according to claim 8, further comprising:
waiting to issue the first PRE command, by the memory control circuit, for duration of the time interval from issuing the first ACT command to issuing the first PRE command.

10. The memory controlling method according to claim 8, further comprising:
waiting command to issue the second ACT command, by the memory control circuit, for duration of the time interval from the issuance of the first PRE command to the issuance of the second ACT.

* * * * *